United States Patent [19]

Goldman

[11] 4,339,529

[45] Jul. 13, 1982

[54] ETCHING METHOD USING A PVA STENCIL CONTAINING N-METHYLOL ACRYLAMIDE

[75] Inventor: Abraham Goldman, Kendall Park, N.J.

[73] Assignee: RCA Corporation, New York, N.Y.

[21] Appl. No.: 269,528

[22] Filed: Jun. 2, 1981

[51] Int. Cl.$^3$ .......................... C23F 1/02; G03C 5/00
[52] U.S. Cl. ..................................... 430/323; 430/28; 430/283; 430/289; 430/318; 430/329; 156/659.1; 156/904
[58] Field of Search ............... 430/270, 274, 283, 289, 430/318, 323, 28, 29; 156/659.1, 904; 525/61, 59; 134/2, 40; 260/29.6 B, 29.6 WA

[56] References Cited

U.S. PATENT DOCUMENTS

| | | | |
|---|---|---|---|
| 3,589,907 | 6/1971 | Dijkstra | 96/93 |
| 3,625,746 | 12/1971 | Ayukawa et al. | 260/17.3 |
| 3,730,933 | 5/1973 | Stehle et al. | 428/261 |
| 3,925,289 | 12/1975 | Sakato et al. | 260/29.6 B |
| 4,061,529 | 12/1977 | Goldman et al. | 156/644 |
| 4,158,566 | 6/1979 | Goldman | 430/270 |
| 4,208,242 | 6/1980 | Zampiello | 156/904 |

*Primary Examiner*—Edward C. Kimlin
*Assistant Examiner*—F. K. Wine
*Attorney, Agent, or Firm*—E. M. Whitacre; D. H. Irlbeck; L. Greenspan

[57] ABSTRACT

The method comprises producing on the surface to be etched a stencil of a light-hardened PVA. The stencil is produced by light hardening selected portions of a film or coating consisting essentially of dichromate-sensitized PVA containing about 5 to 30 weight percent with respect to the weight of PVA solids of N-methylol acrylamide. After light hardening, the nonhardened portions of the film are removed, thereby producing the stencil. The stencil is baked to improve its etch resistance, the surface is etched through the stencil, and then the stencil is removed from the surface.

10 Claims, 5 Drawing Figures

ETCHING METHOD USING A PVA STENCIL CONTAINING N-METHYLOL ACRYLAMIDE

BACKGROUND OF THE INVENTION

This invention relates to a novel method of etching a metal body and, particularly, to an etching method that includes producing on the surface of the body an etch-resistant stencil of light-hardened poly(vinyl alcohol-acetate). The stencil is easily removable with the aid of a dilute aqueous alkali solution after the etching step is completed. Poly(vinyl alcohol-acetate) is also designated herein as PVA.

The preparation of apertured masks by photoexposure and etching has been described previously, for example, in U.S. Pat. No. 4,061,529 issued Dec. 6, 1977 to A. Goldman et al. In a typical process, light-sensitive coatings of sensitized protein materials are applied to both major surfaces of a thin metal sheet, such as a sheet of a cold-rolled steel or of a copper-nickel alloy. The coatings are exposed to light images, as by contact-printing exposure, to harden (render less soluble) the exposed portions of the coatings in an aqueous solvent. The exposed coatings are developed by removing only the more-soluble portions of the coatings, thereby producing a stencil on each surface of the sheet. Then, the stencils are baked to make them more resistant to an etchant, usually an aqueous ferric chloride-hydrochloric acid solution. The sheet with the baked stencils thereon is selectively etched as desired, after which the stencils are removed from the sheet.

In present commercial practice, the light-sensitive coatings are a dichromate-sensitized casein; such as the coatings disclosed in the above-cited Goldman et al. patent. Etch resistance is developed by baking the coatings in air at about 260° C. to 350° C. After etching with a ferric chloride-hydrochloric acid solution, the stencils are removed by applying thereto a hot aqueous solution of sodium hydroxide.

It is desirable to provide alternative light-sensitive coatings, particularly light-sensitized synthetic materials in place of the light-sensitized protein materials that are presently used. In addition, it is desirable to reduce the costs of materials and manufacture of the etched product. U.S. Pat. No. 4,208,242 issued June 17, 1980 to P. Zampiello suggests using films of dichromate-sensitized poly(vinyl alcohol-acetate) as the light-sensitive coating for making apertured masks in steel sheets. The PVA employed in these films is 98.5% to 100% hydrolyzed and has a molecular weight of about 14,000. The films, after developing, are baked at about 250° C. to 300° C. for about 2 to 3 minutes to improve the acid resistance thereof. This produces very adherent stencils which require a special treatment to remove them. That treatment requires, after etching the sheet, baking the stencils at about 250° C. to 300° C. until the stencils are carmelized. Then, the carmelized stencils can be removed with a hot aqueous sodium hydroxide solution.

SUMMARY OF THE INVENTION

The novel method follows the prior methods except in the following important respects. The novel method employs coatings of dichromate-sensitized PVA and N-methylol acrylamide, also referred herein as NMA. The amount of NMA may be about 5 to 30 weight percent of the PVA present. As a result, the stencils can be baked in a lower temperature range of about 200° C. to 240° C. for 120 to 300 seconds prior to etching in order to improve the acid resistance thereof. In addition, after the etching step, the stencils do not require baking or carmelizing or any other special treatment in order to remove the stencils effectively. Finally, more dilute aqueous solutions of alkali can be used to remove the stencils from the metal body.

DETAILED DESCRIPTION OF THE PREFERRED EMBODIMENT

Figure 1:
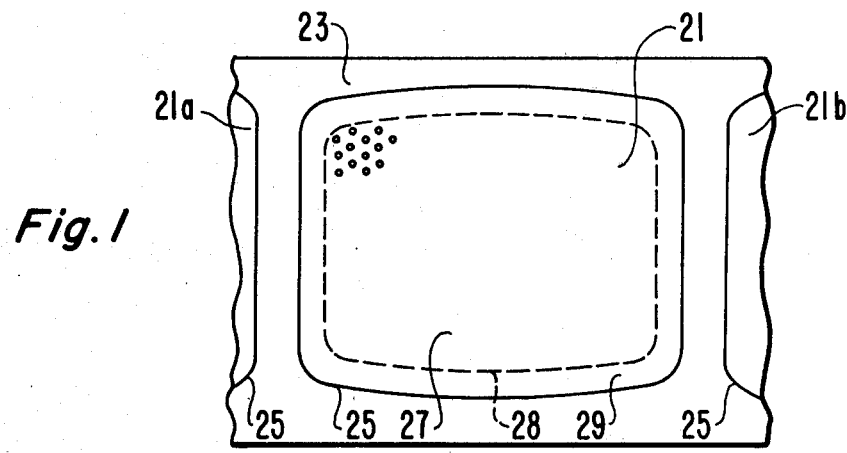
FIG. 1 is a plan view of a metal sheet after etching according to the novel method.

FIG. 1 shows a plan view of an etched apertured mask blank 21 as it emerges from an etching machine. The mask blank 21 (which is to be used in a color-television picture tube) is in a metal sheet 23 comprising a succession of such mask blanks 21a, 21 and 21b which are etched through at the margins 25 thereof except at convenient points (not indicated) sufficient to hold the mask blank 21 in place in the sheet 23. The mask blank 21 is comprised of an apertured central portion 27 defined by the broken line 28; and a skirt or peripheral portion 29 which is not apertured, although in some embodiments it may be etched partly through. The novel method is particularly concerned with the etch-resistant stencil used for etching the apertures in the apertured central portion 27. The apertures may be round and arranged in a hexagonal, diamond-shaped or other array. Or, the apertures may be rectangular slits arranged in vertical columns; for example, columns of 6-mil by 30-mil slits on 30-mil centers horizontally. The apertures may be of other shapes and arrangements. In any of the embodiments, the aperture width may be uniform across the mask or may be graded in width, height or diameter from the center to the edge of the array as is known in the art.

The mask blank 21 is etched into a regular-carbon or a low-carbon cold-rolled-steel sheet about 4 to 10 mils in thickness. The etching also may be conducted in sheets of other materials, such as invar alloy, or copper-nickel alloy. The sheet 23 is passed through the various operations including cleaning the sheet, producing etch-resistant stencils on the sheet, etching the sheet to produce the apertures and to define the mask blanks, and then stripping the stencils from the sheet. Subsequently, the mask blanks 21 are separated from the sheet 23. The mask blanks 21 are then heat treated (annealed), roller leveled, formed on a press, and then blackened as is known in the art, to produce masks suitable for assembly into a color-television picture tube.

Figure 2:
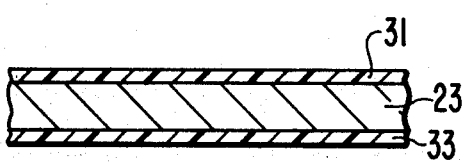
FIGS. 2 through 5 are sectional views through the width of one aperture location of a metal sheet illustrating the steps of one embodiment of the novel method.
Figure 3:
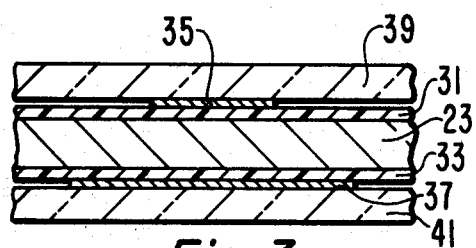

FIGS. 2 through 5 illustrate the novel method by a sequence of steps that may be used in making an aperture in the central portion 27 of a columnar array of slit apertures in a 6-mil-thick strip of low-carbon cold-rolled steel, as shown in FIG. 1. The sheet 23 is coated on both major surfaces with one of the liquid coating compositions set forth below. The coatings are dried in air, producing light-sensitive coatings 31 and 33 of dichromate-sensitized PVA, as shown in FIG. 2. After the coatings have dried, the coated strip is positioned in a chase between two dimensionally-related, light-opaque master patterns; one master pattern 35 for the coating 31 on the one major surface of the sheet 23; and the other master pattern 37 for the other coating 33 on the other major surface of the sheet 23, as shown in FIG. 3. The light-opaque patterns physically contact the coatings 31 and 33. The one master pattern 35 has a rectangular shape about 5 mils wide by about 30 mils high. The other master pattern 37 has a rectangular shape about 16 mils wide by about 30 mils high. Center lines of the one and the other master patterns are coincident, but may be offset from one another if desired.

With the patterns 35 and 37 positioned as shown in FIG. 3, the coatings 31 and 33 on each of the surfaces of the sheet 23 are now exposed to hardening radiation, as from a carbon-arc source, or xenon radiation lamp, which radiation passes through the glass plates 39 and 41 incident on the coatings 31 and 33 except where the one and the other master patterns 35 and 37 shadow the coatings. When the coatings are suitably exposed, the exposure is stopped, and the master patterns are removed.

Figure 4:
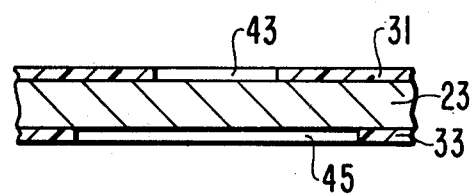

The coatings 31 and 33 are now developed as by spraying with water or other solvent to remove the unexposed, more-soluble, shadowed portions of the coatings 31 and 33. As shown in FIG. 4, after development, the sheet 23 carries on its one major surface a stencil comprising a coating 31 having a first rectangular opening 43 therein and, on its other major surface, a stencil comprising a coating 33 having a second rectangular opening 45 therein. The stencil coatings 31 and 33 with the openings 43 and 45 therein are now baked in air at bake-in temperatures of about 200° C. to 240° C. to harden the stencil; that is, to develop better etch-resistance in the coatings.

Figure 5:
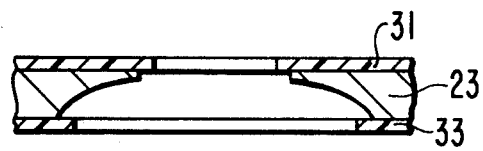

The sheet 23 with the etch-resistant stencils thereon is now selectively etched from both sides thereof in a single step or in successive steps to produce the desired aperture. FIG. 5 shows the stencil-coated sheet 23 at the end of etching. The etching is conducted in the usual manner employing a ferric-chloride hydrochloric-acid liquid etchant. Controlled amounts of chlorine gas are fed into the etchant to maintain its etching strength.

After the etching has been completed, the coated sheet 23 is washed with water to remove any residual etchant. Then, the etch-resistant stencils 31 and 33 are removed from the sheet 23, as by spraying thereon an aqueous solution of sodium hydroxide maintained at temperatures of about 50° C. to 80° C. After removing the stencils, the sheet 23 is washed in water and dried.

In a comparative study of the adhesion of acid-resistant stencils, liquid coating compositions with different PVAs were prepared of the following basic composition in weight percents:

|  | Wt. % |
| --- | --- |
| PVA Solids | 4.0 |
| Sodium Dichromate | 0.3 or 0.4 |
| N-Methylol Acrylamide | 0.0 or 0.6 |
| Deionized Water | balance to 100 |

The pH of the composition is not altered by the presence or absence of N-methylol acrylamide. The pH of the composition is about 5.0 to 5.5, being slightly more acid with the higher amount of sodium dichromate. The different PVAs used are marketed either under the trade name GELVATOL by Monsanto Plastic & Resin Co., Indian Orchard, Mass., or under the trade name VINOL by Air Products & Chemicals, Inc., Allentown, Pa. The PVAs used and their approximate percent hydrolysis and approximate molecular weight are as follows:

|  | % Hydrolyzed | Mol. Wt. |
| --- | --- | --- |
| GELVATOL 20/90 | 85–88 | 125,000 |
| GELVATOL 20/60 | " | 96,000 |
| GELVATOL 20/30 | " | 10,000 |
| GELVATOL I-30 | 98–100 | 14,000 |
| VINOL 107 | 98–98.8 | 22–31,000 |
| VINOL 205 | 87–89 | 22–31,000 |

To prepare the coating compositions, the deionized water was heated to about 50° C. to 60° C., then the PVA was added in a steady stream with vigorous agitation of the solution. After all of the PVA had been added and dissolved, the solution was cooled to room temperature, and then the viscosity was measured. Just before usage, the sodium dichromate was added, which lowered the pH of the solution to about 4.7 to 5.5. The compositions were spin coated on surfaces of cold-rolled-steel pieces and dried. Then the dry coatings were exposed through photographic negatives to light from a pulse xenon lamp for about 2 minutes (about 187 millijoules). The exposed coatings were developed with a spray of 30° C. deionized water at 10 psi for 15 to 20 seconds to produce acid-resistant stencils. The following are observations of adhesion of the stencils to the metal surfaces in the study. A "zero" indicates the stencil lost adhesion during development and washed off. A "one" indicates the stencil did not wash off during development but did not survive the etching step. A "two" indicates that the stencil survived both development and the etching step.

| PVA | Weight Percent Dichromate | Weight Percent NMA | Result |
| --- | --- | --- | --- |
| GELVATOL 20/30 | 0.4 | 0.0 | 0 |
| GELVATOL 20/30 | 0.3 | 0.6 | 2 |
| GELVATOL 20/60 | 0.4 | 0.0 | 0 |
| GELVATOL 20/60 | 0.3 | 0.6 | 2 |
| GELVATOL 20/90 | 0.4 | 0.0 | 0 |
| GELVATOL 20/90 | 0.3 | 0.6 | 2 |
| GELVATOL I-30 | 0.4 | 0.0 | 0 |
| GELVATOL I-30 | 0.3 | 0.6 | 2 |
| VINOL 205 | 0.4 | 0.0 | 0 |
| VINOL 205 | 0.3 | 0.6 | 2 |
| VINOL 107 | 0.4 | 0.0 | 0 |
| VINOL 107 | 0.3 | 0.6 | 1 |

This data indicates that the addition of NMA increases the photosensitivity of the coating and also increases the adhesion of the light-hardened portions of the coatings to the mtal surface. The surviving coatings were baked-in at about 220° C. Then, the metal pieces were etched. After etching, the coatings were easily and completely removed from the metal surfaces without baking by immersion in a 4-weight-percent sodium hydroxide solution for about 2 minutes in combination with a light brushing.

In the coating composition used in the novel method, several factors are important:

1. Any PVA that is 85% to 100% hydrolyzed and has a molecular weight of about 10,000 to 150,000 may be used. These are synthetic polymeric materials that are available under various trade names. A stencil made of a PVA with higher percents hydrolysis (above 97% hydrolyzed) requires a higher baking temperature prior to etching. It is noteworthy that the novel method can use PVAs from much wider ranges of molecular weight and degrees of hydrolysis than the PVAs disclosed in the Zampiello patent, op. cit.

2. Among sodium, potassium and ammonium dichromate photosensitizers, sodium dichromate is the preferred dichromate because it imparts greater shelf stability. The photosensitizer comprises about 0.03 (3%) to 0.15 (15%) of the weight of the PVA present, and determines the pH of the coating composition. More than 15% dichromate results in poor adhesion of the photoexposed portions of the stencil. The photoexposure times of the coatings are equivalent to those used for dichromate sensitized casein coatings.

3. N-methylol acrylamide as an additive to the composition is a bifunctional organic compound whose structural formula is

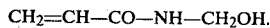

$$CH_2=CH-CO-NH-CH_2OH.$$

The compound is synthesized from the condensation of formaldehyde and acrylamide. It reacts in acidic media as if it were a formaldehyde precursor. Formaldehyde is known to crosslink PVA. Other N-methylol amides, such as methacrylamide, acetamide and formamide, did not perform in a similar manner, i.e., they did not increase the light sensitivity, or impart shelf stability, or decrease the bake-in temperature. The weight percent of NMA is about 5 to 30% of PVA solids present, and preferably about 5 to 15 weight percent of the PVA present.

4. No surfactant is used in the coating compositions because its presence reduces the adherence of the photoexposed coatings of the developed but unbaked stencils.

5. No borax is used in the coating compositions because it gels the composition and generally makes it more difficult to coat the composition. Small amounts of a base, such as ammonium hydroxide, can be used to raise the pH of the coating composition.

6. Coating thicknesses on the metal sheet are important parameters in mask manufacturing. If the coating is too thin, under 40 microinches, the etching will be non-uniform and cause mask defects. If the coating is too thick, over 200 microinches, the coating will require longer exposure times and there may be mechanical problems, pumpdown problems and poor mask uniformity.

7. The preferred bake-in temperature for imparting etch resistance to a developed PVA coating is in the range of 200° C. to 240° C. PVA coatings baked at these lower temperatures are most efficiently removed by caustic wash after etching. Generally, the higher the temperature of the etchant used, the higher should be the bake-in temperature for the developed coating. The lower bake-in temperatures used in the novel method can result in savings in energy and cost as compared with prior methods which require higher bake-in temperatures.

8. After etching, the hardened stencils may be removed from the metal sheet with hot (50° C. to 80° C.) dilute (2 to 10 weight percent) sodium hydroxide solution. A light brushing permits the removal of the stencil in about 1 to 5 minutes. Without brushing, but using a spray of the solution, 3 to 10 minutes may be required to remove the stencils. Any alkali solution may be used, and the selection of temperature, concentration and time of application may be optimized by a relatively few trials by persons of ordinary skill in the art.

9. The novel method does not require the step of carmelizing the stencils prior to applying the alkali solution, resulting in a savings in energy and cost as compared to the method disclosed in Zampiello, op. cit. which requires carmelizing. In fact, after the etching step, baking of the stencils is limited to temperatures of less than 200° C. in the novel method.

10. A. Goldman discloses in U.S. Pat. No. 4,158,566 issued June 19, 1979, using NMA with dichromate sensitized casein to produce acid-resistant stencils on metal surfaces. The presence of NMA lowers the temperatures required for baking-in as in the novel method. However, the coating compositions for preparing these stencils require an alkalizer, such as borax, and a surfactant, both of which cannot be used in the novel method.

What is claimed is:

1. In a method of etching a metal body including producing a stencil of a light-hardened poly(vinyl alcohol-acetate) on a surface of said body, baking said stencil to improve the resistance thereof to liquid etchant, etching said surface through said stencil with said etchant, baking said stencil after said etching and then removing said stencil from said surface, the improvement comprising producing said stencil by light-hardening selected portions of a film consisting essentially of a dichromate-sensitized poly(vinyl alcohol-acetate) that is about 85% to 100% hydrolyzed and about 5 to 30 weight percent with respect to the weight of polyvinyl alcohol-acetate of N-methylol acrylamide, and then selectively removing the substantially nonhardened portions of said film.

2. The method defined in claim 1 wherein said film contains about 5 to 15 weight percent with respect to the weight of poly(vinyl alcohol-acetate) present of N-methylol acrylamide.

3. The method defined in claim 1 wherein said stencil is baked at about 200° C. to 240° C. prior to said etching step.

4. The method defined in claim 1 wherein the baking of said stencil, after said etching step, is limited to temperatures of less than 200° C.

5. The method defined in claim 1 wherein during the step of removing said stencil, said stencil is contacted with a dilute aqueous solution of alkali for about 1 to 10 minutes.

6. In a method of etching selected areas of a surface of a metal body including producing an etch-resistant stencil of light-hardened PVA on said surface, baking said stencil to improve the resistance of said stencil to attack by liquid acid, etching said surface by contacting said baked stencil and said surface with said liquid acid until said selective etching is achieved, baking said stencil after said etching and then removing said stencil from said surface, the improvement comprising producing said stencil by light hardening selected portions of a film consisting essentially of dichromate-sensitized PVA that is about 85% to 100% hydrolyzed and about 5 to 30 weight percent with respect to the weight of PVA solids of N-methylol acrylamide, and then removing the nonselected film portions while retaining said selected film portions in place, and wherein the baking of said stencil after said selective etching is limited to temperatures of less than 200° C.

7. The method defined in claim 6 wherein said body is a metal strip or plate having two opposed major surfaces, and dimensionally-related stencils are produced on both major surfaces.

8. The method defined in claim 6 wherein said film contains PVA and sodium dichromate in the weight ratio range of 85/15 to 95/5 respectively.

9. The method defined in claim 6 wherein, prior to said etching step, said stencil is baked at about 200° C. for about 5 minutes to improve the resistance thereof to attack by aqueous inorganic acid.

10. The method defined in claim 6 wherein, after said etching step, the temperature of said stencil is maintained below 200° C., and said stencil is contacted with a dilute aqueous alkali hydroxide solution having a temperature of about 75° C. to 85° C.

* * * * *